United States Patent
Cho et al.

(10) Patent No.: US 8,182,904 B2
(45) Date of Patent: May 22, 2012

(54) LAMINATED CERAMIC PACKAGE

(75) Inventors: Beom Joon Cho, Gyunggi-do (KR); Jong Myeon Lee, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/314,206

(22) Filed: Dec. 5, 2008

(65) Prior Publication Data
US 2009/0148710 A1 Jun. 11, 2009

(30) Foreign Application Priority Data
Dec. 6, 2007 (KR) .................. 10-2007-0126443

(51) Int. Cl.
*H05K 1/00* (2006.01)

(52) U.S. Cl. ........ 428/210; 428/212; 428/901; 174/255; 174/258; 257/701; 361/760; 361/762; 156/89.12

(58) Field of Classification Search .................. 428/210, 428/901, 212; 174/250–258; 257/701; 361/760, 361/762; 156/89.12
See application file for complete search history.

(56) References Cited

U.S. PATENT DOCUMENTS

| | | | | |
|---|---|---|---|---|
| 6,337,123 | B1 * | 1/2002 | Ryugo et al. | 428/210 |
| 6,673,180 | B2 * | 1/2004 | Harada | 156/89.11 |
| 6,743,316 | B2 * | 6/2004 | Harada et al. | 156/89.11 |
| 6,815,046 | B2 * | 11/2004 | Mandai et al. | 428/210 |
| 6,896,953 | B2 * | 5/2005 | Taga et al. | 428/210 |

FOREIGN PATENT DOCUMENTS

| | | |
|---|---|---|
| JP | 09-071472 | 3/1997 |
| JP | 2002-111210 | 4/2002 |
| JP | 2006-210675 | 8/2006 |
| JP | 2007-067364 | 3/2007 |
| KR | 10-2006-0106291 A | 10/2006 |

OTHER PUBLICATIONS

Japanese Office Action, with English Translation, issued in Japanese Patent Application No. 2008-311562, dated Jan. 11, 2011.

* cited by examiner

*Primary Examiner* — Cathy Lam
(74) *Attorney, Agent, or Firm* — McDermott Will & Emery LLP

(57) ABSTRACT

Provided is a laminated ceramic package. The laminated ceramic package includes a laminated ceramic substrate having a conductive pattern therein, a first ceramic layer on the laminated ceramic substrate, and a second ceramic layer on the first ceramic layer. The first ceramic layer has a firing area shrinkage rate of about 1% or less. The second ceramic layer has a cavity receiving electronic components and a different firing shrinkage rate from the first ceramic layer.

4 Claims, 2 Drawing Sheets

LAMINATED CERAMIC PACKAGE

CROSS-REFERENCE TO RELATED APPLICATIONS

This application claims the priority of Korean Patent Application No. 2007-126443 filed on Dec. 6, 2007, in the Korean Intellectual Property Office, the disclosure of which is incorporated herein by reference.

BACKGROUND OF THE INVENTION

1. Field of the Invention

The present invention relates to a laminated ceramic package, and more particularly, to a laminated ceramic package capable of precisely adjusting the dimensions of a cavity mounted with electronic components by suppressing a firing shrinkage in the cavity.

2. Description of the Related Art

Recently, the miniaturization of circuit components is increasingly being required in the technical field of a mobile communication device such as a cellular phone. Also, technologies of embedding devices such as a capacitance device and an inductance device in a ceramic body using Low Temperature Co-fired Ceramics (LTCC) have been introduced.

In a laminated ceramic package using a ceramic laminated substrate, a cavity is formed in the laminated ceramic package. Then, the electronic components may be mounted on the ceramic laminated substrate in the cavity, and fixed on a substrate through a molding process.

When the cavity is formed on the ceramic laminated substrate, there is a limitation in securing the dimensional accuracy of the cavity. Generally, in order to manufacture a ceramic package, the following processes are performed. First, a plurality of green sheets are laminated to form a laminated body. A cavity capable of receiving chips is formed by removing a partial section of the laminated body through punching or laser processing. Then, the ceramic package is formed through a non-shrinkage firing process by positioning the laminated body between constraint layers. The inner part of the cavity is divided into a region for mounting the electronic components and a region for a wire-bonding, and formed in a stepped shape.

In order to prevent a horizontal (X or Y-axis) directional shrinkage and allow a vertical (Z-axis) directional shrinkage during firing, the non-shrinkage firing process may include forming the constraint layers formed of a material, which may not be fired at a firing temperature of the laminated body, on the upper and lower surfaces of the laminated body, and pressing the laminated body during the firing process.

However, when the cavity is formed on the laminated body in order to implement the ceramic package having the cavity receiving the electronic components, the constraint layer for pressing the laminated body may not be in substantial contact with the laminated body at the inner part of the cavity. Accordingly, during firing, the horizontal shrinkage of a green sheet of a region contacting the constraint layer is suppressed, but the horizontal shrinkage of a green sheet of a region not contacting the constraint layer is not suppressed, so that a accuracy difference between the both green sheets may occur.

SUMMARY OF THE INVENTION

An aspect of the present invention provides to a laminated ceramic package capable of precisely adjusting the dimensions of a cavity mounted with electronic components by suppressing a firing shrinkage in the cavity.

According to an aspect of the present invention, there is provided a laminated ceramic package including: a laminated ceramic substrate having a conductive pattern therein; a first ceramic layer on the laminated ceramic substrate having a firing area shrinkage rate of about 1% or less; and a second ceramic layer on the first ceramic layer, having a cavity receiving electronic components and a different firing shrinkage rate from the first ceramic layer.

The first ceramic layer may include a flake-type ceramic filler and a glass.

The flake-type ceramic filler may include a flake-type alumina.

The second ceramic layer may include: a lower layer having a cavity exposing a part of the first ceramic layer to mount the electronic components on the first ceramic layer; and an upper layer having a cavity greater than the cavity of the lower layer.

According to another aspect of the present invention, there is provided a laminated ceramic package including: a laminated ceramic substrate having a conductive pattern therein; and a ceramic layer on the laminated ceramic substrate, having a cavity receiving electronic component and a firing area shrinkage rate of about 1% or less.

The ceramic layer may include a flake-type ceramic filler and a glass.

The flake-type ceramic filler may include a flake-type alumina.

The ceramic layer may include: a lower layer having a cavity exposing a part of the ceramic substrate to mount the electronic components on the ceramic substrate; and an upper layer having a cavity greater than the cavity of the lower layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Hereinafter, exemplary embodiments of the present invention will now be described in detail with reference to the accompanying drawings.

Figure 1:
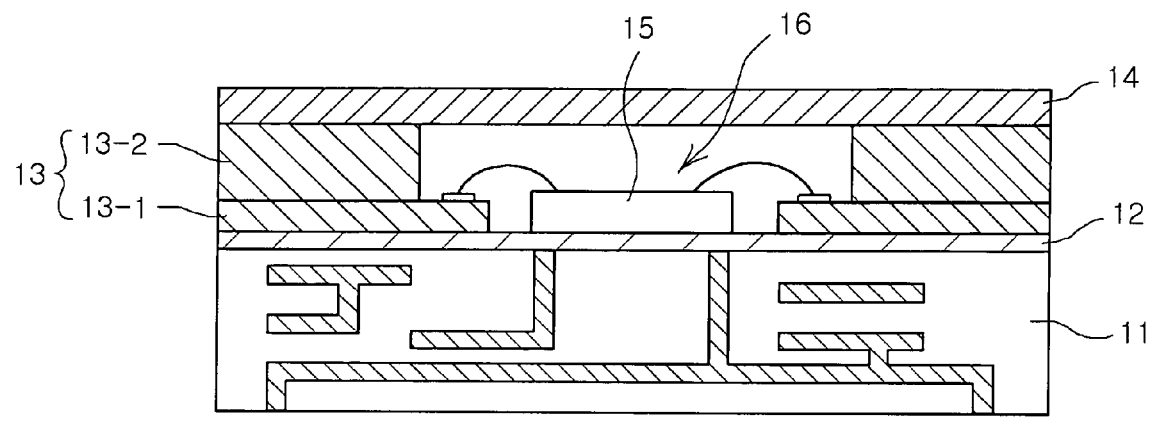
FIG. 1 is a sectional view illustrating a laminated ceramic package according to an embodiment of the present invention.

FIG. 1 is a sectional view illustrating a laminated ceramic package according to an embodiment of the present invention.

Referring to FIG. 1, the laminated ceramic package according to an embodiment of the present invention may include a ceramic substrate 11, a first ceramic layer 12 laminated on the ceramic substrate 11, a second ceramic layer 13 laminated on the first ceramic layer 12, and a lead 14.

The upper ceramic substrate 11 may be formed by firing a plurality of green sheets. A conductive pattern may be formed on the plurality of green sheets forming the ceramic substrate 11. A conductive via may be formed in each green sheet to electrically connect between the laminated green sheets.

The first ceramic layer 12 may be formed on the ceramic substrate 11. The first ceramic layer 12 may have a horizontal shrinkage rate of about 1% or less during firing. The first ceramic layer 12 may include a flake-type ceramic filler and a glass. The flake-type ceramic filler may be a flake-type alumina.

Electronic components 15 may be mounted on the first ceramic layer 12. A conductive via may be formed in the first ceramic layer 12 to electrically connect between the electronic components and the ceramic substrate 11.

The first ceramic layer 12 may be formed by firing a first green sheet manufactured from a first ceramic slurry including the flake-type ceramic powder and glass. Compared to the related art green sheet using the ceramic powder, the green sheet according to this exemplary embodiment may have a significantly small horizontal shrinkage rate during firing because the shape of the ceramic power included in the first green sheet is the flake-type.

The second ceramic layer 13 may be formed on the upper surface of the first ceramic layer 12. The cavity 16 receiving the electronic components 15, which are mounted on the first ceramic layer 12, may be formed in the second ceramic layer 13. The second ceramic layer 13 may include the ceramic filler and glass component. The second ceramic layer may have a different firing shrinkage rate from the first ceramic layer.

According to this exemplary embodiment, the second ceramic layer 13 may include a lower layer 13-1 having a certain size of cavity, and an upper layer 13-2 having a cavity greater than the cavity formed in the lower layer 13-1. An electrode wire-bonded to the electronic components may be formed on the lower layer 13-1 exposed by the size difference between the cavities.

The second ceramic layer 13 may be formed through a firing process after laminating a plurality of second green sheets manufactured from a second ceramic slurry including ceramic powder and glass component. According to this exemplary embodiment, the ceramic powder included in the second green sheet may be a different flake-type ceramic powder from the flake-type ceramic powder included in the first green sheet.

The electronic components may be arranged in the cavity 16 formed in the second ceramic layer 13. Then, the lead 14 covering the cavity 16 may be formed. The lead 14 may seal the cavity to protect the electronic components from the outside environment. The cavity may be filled with a molding resin instead of the sealing by the lead 14.

According to this exemplary embodiment, a firing shrinkage rate of the first ceramic layer 12 may be smaller than a firing shrinkage rate of the second ceramic layer 13. That is, the first green sheet for forming the first ceramic layer 12 may have a different firing shrinkage characteristic from the second green sheet for forming the second ceramic layer 13.

According to this exemplary embodiment, the first green sheet having a smaller shrinkage rate serves as a constraint layer against the second green sheet having a greater shrinkage rate by firing a laminated body which is formed such that the first green sheet and the second green sheet may contact each other.

In order to form the laminated ceramic package, the firing process may be performed after the constraint layers are contacted to the upper surface and the lower surface of the laminated body. If there is the cavity in the laminated ceramic package, the constraint layers have no effect on the ceramic green sheet exposed to the inner part of the cavity. Accordingly, there may be a great horizontal shrinkage in the exposed ceramic green sheet, causing dimension defectiveness.

According to this exemplary embodiment, in order to suppress the horizontal shrinkage of the exposed ceramic green sheet in the cavity on which the constrain layer have no effect, the first green sheet may be intervened between the laminated body forming the ceramic substrate and the second green sheet forming the second ceramic layer.

As described above, FIG. 1 illustrates a ceramic package after a firing process. Hereinafter, a process of manufacturing the ceramic package will be described.

First, the laminated body forming the ceramic substrate 11 may be manufactured. The laminated body forming the ceramic substrate 11 may be formed by laminating the plurality of green sheets. The plurality of green sheets may be manufactured from the ceramic slurry including the ceramic powder and glass component. The conductive pattern and the conductive via hole may be formed in each green sheet.

The first ceramic green sheet may be laminated on the laminated body to form the first ceramic layer 12. The first green sheet may be manufactured from a slurry including the flake-type ceramic powder and glass component.

Next, the second green sheet forming the second ceramic layer 13 may be laminated on the first ceramic layer 12. The second green sheet may be manufactured from a slurry including the ceramic powder and glass component. The second ceramic layer 13 may include a plurality of the second green sheets.

The cavity receiving the electric components may be formed by punching the laminated second green sheets. In this case, the section of the cavity may have a stepped shape.

The constraint layers are formed on the upper and lower surfaces of a laminated structure of the laminated body forming the ceramic substrate, the first green sheet, and the second green sheet including the cavity, which is fired to form the ceramic package. A process of manufacturing the ceramic package may be completed by installing the electronic components in the ceramic package and sealing the electronic components using the lead 14.

According to this exemplary embodiment, the laminated body forming the ceramic substrate, the first green sheet and the second green sheet are simultaneously fired to form the ceramic substrate 11, the first ceramic layer 12, and the second ceramic layer 13, respectively. However, the first and second green sheets may be laminated after the ceramic substrate 11 is formed through a firing of the laminated body.

Figure 2:
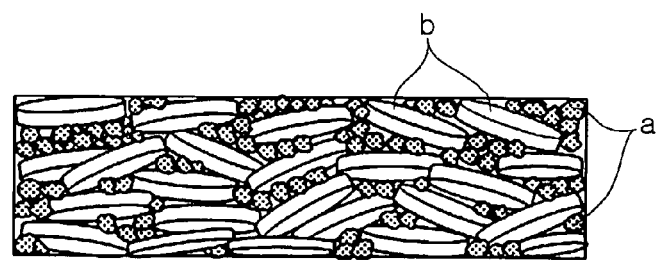
FIG. 2 is a diagram illustrating a structure of a first green sheet for forming a first ceramic layer used in the laminated ceramic package in FIG. 1.

FIG. 2 is a diagram illustrating a structure of a first green sheet for forming a first ceramic layer used in the laminated ceramic package in FIG. 1.

Referring to FIG. 2, the first green sheet according to this exemplary embodiment may include a glass component a and a flake-type ceramic powder b. The flake-type ceramic powder may be a flake-type alumina.

In order to manufacture the first green sheet forming the first ceramic layer according to this exemplary embodiment, a slurry may be manufactured by adding an acryl series binder of about 15 wt %, a dispersing agent of about 0.5 wt %, and a mixed solvent of toluene and ethanol relative to a mixture of flake-type ceramic powder and glass powder of 100%. In the mixture of the flake-type ceramic powder and glass powder, the content of the glass powder may be about 20% to about 70%, preferably, about 30% to about 50%. Then, bubbles may be removed from the slurry through a filter. Through a doctor blade method, a first green sheet of about thickness 50 μm may be formed from the slurry. The first green sheet may be fired to form the first ceramic layer.

In this exemplary embodiment, the diameter of the glass powder may be about 0.5 μm to about 3 μm. The flake-type ceramic powder may have the diameter of about 10 μm, and the thickness of about 0.2 μm.

The diameter of the flake-type ceramic powder may be greater than the diameter of glass powder. If the thickness of the flake-type ceramic powder is smaller than about 0.1 μm, the flake-type ceramic powder may be broken during the milling process.

Figure 3:
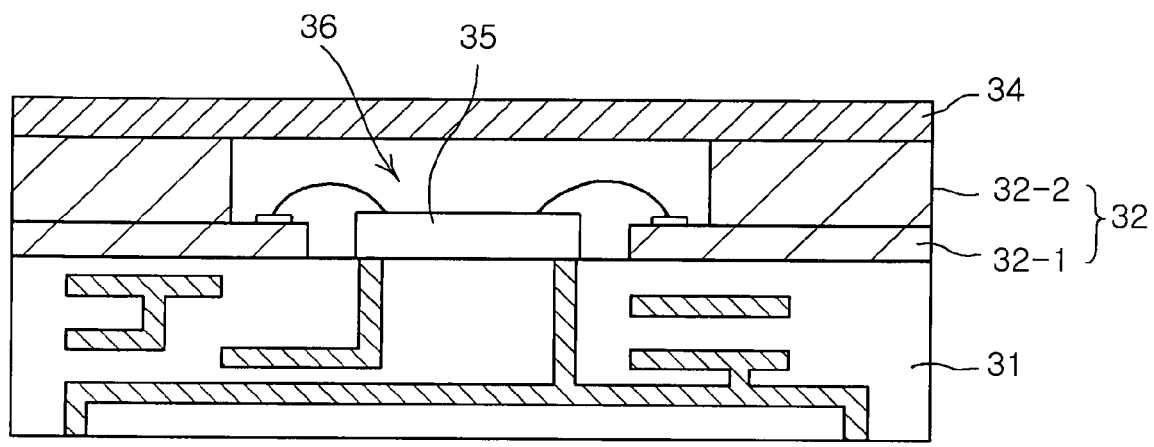
FIG. 3 is a sectional view illustrating a laminated ceramic package according to another embodiment of the present invention.

FIG. 3 is a sectional view illustrating a laminated ceramic package according to another embodiment of the present invention.

Referring to FIG. 3, a laminated ceramic package according to another exemplary embodiment may include a ceramic substrate 31, a laminated ceramic layer 32 laminated on the ceramic substrate 31, and a lead 34.

The ceramic substrate 31 may be fired by laminating a plurality of green sheets. A conductive pattern may be formed on the plurality of the green sheets. The conductive pattern may be connected by a conductive via hole.

The first ceramic layer 32 may be formed on the ceramic substrate 31. The first ceramic layer 32 may have a horizontal shrinkage rate of about 1% or less during firing. The first ceramic layer 32 may include a flake-type ceramic filler and a glass. The flake-type ceramic filler may be a flake-type alumina.

According to this exemplary embodiment, the ceramic layer 32 may include a lower layer 32-1 having a certain size of cavity exposing a part of the ceramic substrate 31, and an upper layer 32-2 having the cavity greater than the cavity formed in the lower layer 32-1. Electronic components 35 may be arranged in the cavity 36 formed in the ceramic layer 32. An electrode wire-bonded to the electronic components may be formed on the lower layer 32-1 exposed by the size difference between the cavities.

The ceramic layer 32 may be formed through a firing process after laminating the green sheet manufactured from a ceramic slurry including flake-type ceramic powder and glass.

The electronic components may be arranged in the cavity 36 formed in the ceramic layer 32. Then, the lead 34 covering the cavity 36 may be formed. The lead 14 may seal the cavity to protect the electronic components from the outside environment. The cavity may be filled with a molding resin instead of the sealing by the lead 34.

In the exemplary embodiment in FIG. 1, in order to suppress the horizontal shrinkage of the second green sheet including a related-art ceramic powder during firing, the first green sheet including the flake-type ceramic powder is used. That is, the firing shrinkage rate of the second green sheet may be suppressed because the firing shrinkage rate of the first green sheet is smaller than that of the second green sheet.

On the contrary, in an exemplary embodiment in FIG. 3, a first green sheet including the flake-type ceramic powder may be used instead of the second green sheet including the related-art ceramic powder to form a ceramic layer having a cavity. Accordingly, the shrinkage of the ceramic layer may be suppressed during firing.

FIG. 3 illustrates a ceramic package after a firing process. Hereinafter, a process of manufacturing the ceramic package will be described.

First, the laminated body forming the ceramic substrate 31 may be manufactured. More concretely, the laminated body forming the ceramic substrate 31 may be formed by laminating the plurality of green sheets. The plurality of green sheets may be manufactured from the ceramic slurry including the ceramic powder and glass component. The conductive pattern and the conductive via hole may be formed in each green sheet.

The green sheet forming the ceramic layer 32 may be laminated on the laminated body of the green sheet for forming the ceramic substrate. The green sheet may be manufactured from a slurry including the flake-type ceramic powder and glass component. In this case, a plurality of the green sheets may be laminated.

The cavity receiving the electric components may be formed by punching the laminated green sheet. In this case, the section of the cavity may have a stepped shape.

The constraint layers are formed on the upper and lower surfaces of a laminated structure of the laminated body forming the ceramic substrate and the green sheet including the cavity, which is fired to form the ceramic package. A process of manufacturing the ceramic package may be completed by arranging the electronic components in the ceramic package and sealing the electronic components using the lead 34.

According to this exemplary embodiment, the laminated body forming the ceramic substrate and the green sheet are simultaneously fired to form the ceramic substrate 31 and the ceramic layer 32, respectively. However, the green sheet may be laminated after ceramic substrate 31 is formed through a firing of the laminated body.

In the laminated ceramic package having the cavity mounted with the electronic components according to the embodiments of the present invention, the laminated ceramic package, dimensions of which can be precisely controlled, can be obtained by suppressing the firing shrinkage in the cavity.

While the present invention has been shown and described in connection with the exemplary embodiments, it will be apparent to those skilled in the art that modifications and variations can be made without departing from the spirit and scope of the invention as defined by the appended claims.

What is claimed is:

1. A laminated ceramic package comprising:
    a laminated ceramic substrate having a conductive pattern therein;
    a first ceramic layer on the laminated ceramic substrate having a horizontal shrinkage rate of about 1% or less during firing and comprising a flake-type ceramic powder or filler; and
    a second ceramic layer on the first ceramic layer, the second ceramic layer having a cavity for receiving electronic components and a different firing shrinkage rate from the first ceramic layer,
    wherein an entire bottom surface of the second ceramic layer is in contact with the top surface of the first ceramic layer.

2. The laminated ceramic package of claim 1, wherein the first ceramic layer further comprises a glass.

3. The laminated ceramic package of claim 1, wherein the flake-type ceramic powder or filler comprises a flake-type alumina.

4. The laminated ceramic package of claim 1, wherein the second ceramic layer comprises:
    a lower layer on the first ceramic layer having a cavity exposing a part of the first ceramic layer to mount the electronic components on the first ceramic layer; and
    an upper layer on the lower layer having a cavity greater than the cavity of the lower layer.

* * * * *